(12) United States Patent
Shibata et al.

(10) Patent No.: US 11,800,808 B2
(45) Date of Patent: Oct. 24, 2023

(54) PIEZOELECTRIC STACK, PIEZOELECTRIC ELEMENT, AND METHOD OF MANUFACTURING PIEZOELECTRIC STACK

(71) Applicant: SUMITOMO CHEMICAL COMPANY, LIMITED, Tokyo (JP)

(72) Inventors: Kenji Shibata, Hitachi (JP); Kazutoshi Watanabe, Hitachi (JP); Toshiaki Kuroda, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 235 days.

(21) Appl. No.: 16/942,813

(22) Filed: Jul. 30, 2020

(65) Prior Publication Data

US 2021/0036213 A1 Feb. 4, 2021

(30) Foreign Application Priority Data

Aug. 2, 2019 (JP) .................... 2019-143327

(51) Int. Cl.
| | | |
|---|---|---|
| *H01L 41/187* | (2006.01) | |
| *H01L 41/27* | (2013.01) | |
| *H01L 41/08* | (2006.01) | |
| *H01L 41/314* | (2013.01) | |
| *H10N 30/853* | (2023.01) | |
| *H10N 30/05* | (2023.01) | |
| *H10N 30/074* | (2023.01) | |
| *H10N 30/00* | (2023.01) | |

(52) U.S. Cl.
CPC ......... *H10N 30/8542* (2023.02); *H10N 30/05* (2023.02); *H10N 30/074* (2023.02); *H10N 30/10516* (2023.02)

(58) Field of Classification Search
CPC ... H01L 41/27; H01L 41/314; H01L 41/0815; H01L 41/1873; H10N 30/05; H10N 30/074; H10N 30/10516; H10N 30/8542
USPC .......................................................... 310/358
See application file for complete search history.

(56) References Cited

U.S. PATENT DOCUMENTS

| | | | | |
|---|---|---|---|---|
| 5,630,949 A | * | 5/1997 | Lakin | ......... H03H 3/04 29/25.35 |
| 2007/0126313 A1 | | 6/2007 | Ueno et al. | |
| 2009/0236944 A1 | | 9/2009 | Shibata et al. | |
| 2014/0339961 A1 | | 11/2014 | Maejima et al. | |
| 2019/0103550 A1 | * | 4/2019 | Kobayashi | ......... B25J 9/12 |
| 2020/0028066 A1 | * | 1/2020 | Shibata | ......... H01L 41/0805 |

FOREIGN PATENT DOCUMENTS

| | | |
|---|---|---|
| EP | 3 364 471 A1 | 8/2018 |
| JP | 2007-184513 A | 7/2007 |
| JP | 2008-159807 A | 7/2008 |

* cited by examiner

*Primary Examiner* — Shawki S Ismail
*Assistant Examiner* — Monica Mata
(74) *Attorney, Agent, or Firm* — Foley & Lardner LLP

(57) ABSTRACT

There is provided a piezoelectric stack, including: a substrate; an electrode film; and a piezoelectric film which is comprised of alkali niobium oxide of a perovskite structure represented by a composition formula of $(K_{1-x}Na_x)NbO_3$ (0<x<1), wherein the piezoelectric film comprises crystals having a grain size with a standard deviation of 0.42 μm or less.

5 Claims, 3 Drawing Sheets

PIEZOELECTRIC STACK, PIEZOELECTRIC ELEMENT, AND METHOD OF MANUFACTURING PIEZOELECTRIC STACK

TECHNICAL FIELD

The present disclosure relates to a piezoelectric stack, a piezoelectric element, and a method of manufacturing a piezoelectric stack.

BACKGROUND

A piezoelectric material is utilized widely for a functional electronic component such as a sensor, and an actuator. Lead-based materials, in particular, PZT-based ferroelectrics represented by a composition formula of $Pb(Zr_{1-x}Ti_x)O_3$ are used widely for the piezoelectric material. Since PZT-based piezoelectric material contains lead, it is not preferable from a viewpoint of a pollution prevention, and the like. Therefore, potassium sodium niobium oxide (KNN) is suggested as a piezoelectric material not containing lead (see patent documents 1 and 2, for example). Recently, it is strongly required to further improve a performance of the piezoelectric material composed of the material not containing lead such as KNN.

Patent document 1: Japanese Patent Laid Open Publication No. 2007-184513
Patent document 2: Japanese Patent Laid Open Publication No. 2008-159807

SUMMARY

An object of the present disclosure is to provide a piezoelectric film comprised of alkali niobium oxide and having a longer life.

According to an aspect of the present disclosure, there is provided a piezoelectric stack, and a related technique thereof, including:
a substrate;
an electrode film; and
a piezoelectric film which is comprised of alkali niobium oxide of a perovskite structure represented by a composition formula of $(K_{1-x}Na_x)NbO_3$ (0<x<1),
wherein the piezoelectric film comprises crystals having a grain size with a standard deviation of 0.42 μm or less.

According to the present disclosure, there is provided a piezoelectric film comprised of alkali niobium oxide and having a longer life.

EMBODIMENTS

An Embodiment of the Present Disclosure

An embodiment of the present disclosure will be described hereafter, with reference to drawings.

(1) A Constitution of a Piezoelectric Stack

Figure 1:
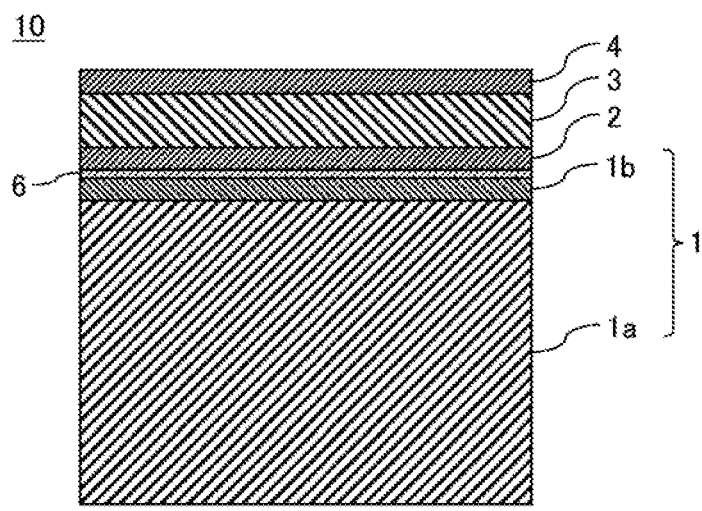
FIG. 1 is a view illustrating an example of a cross-section structure of a piezoelectric stack according to an embodiment of the present disclosure.

As illustrated in FIG. 1, a stack (stacked substrate) 10 (also referred to as piezoelectric stack 10 hereafter) having a piezoelectric film according to a present embodiment, includes a substrate 1, a bottom electrode film 2 formed on the substrate 1, a piezoelectric film (piezoelectric thin film) 3 formed on the bottom electrode film 2, and a top electrode film 4 formed on the piezoelectric film 3.

Figure 2:
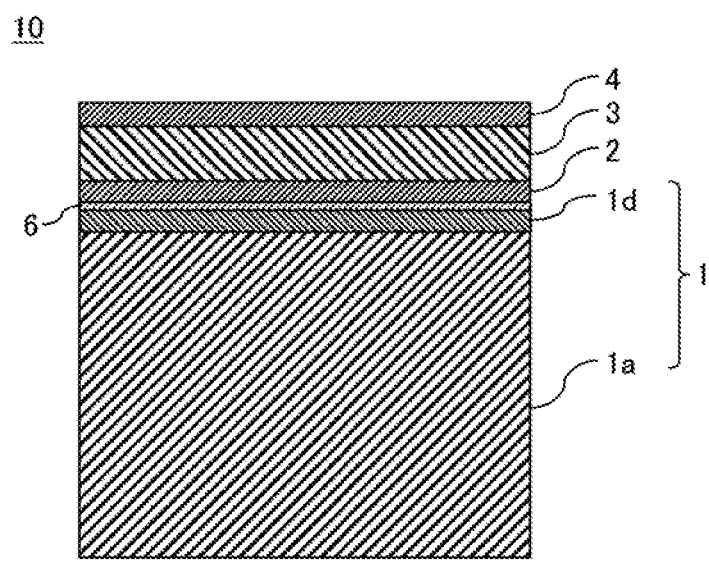
FIG. 2 is a view illustrating a modified example of the cross-section structure of the piezoelectric stack according to an embodiment of the present disclosure.

As the substrate 1, a single-crystal silicon (Si) substrate 1a on which a surface oxide film ($SiO_2$-film) 1b such as a thermal oxide film or a CVD (Chemical Vapor Deposition) oxide film is formed (provided), namely, a Si-substrate including the surface oxide film, can be used preferably. Further, as illustrated in FIG. 2, a Si-substrate 1a including an insulating film 1d formed on its surface may also be used as the substrate 1, the insulating film 1d being comprised of an insulating material other than $SiO_2$. Further, a Si-substrate 1a in which Si-(100) or Si-(111), etc., is exposed on a surface thereof, namely, a Si-substrate not including the surface oxide film 1b or the insulating film 1d may also be used as the substrate 1. Further, an SOI (Silicon On Insulator) substrate, a quartz glass ($SiO_2$) substrate, a gallium arsenide (GaAs) substrate, a sapphire ($Al_2O_3$) substrate, a metal substrate comprised of a metal material such as stainless steel (SUS) may also be used as the substrate 1. The single-crystal Si-substrate 1a has a thickness of, for example, 300 to 1000 μm, and the surface oxide film 1b has a thickness of, for example, 1 to 4000 nm.

The bottom electrode film 2 can be comprised of, for example, platinum (Pt). The bottom electrode film 2 is a single crystal film or a polycrystalline film (these are also referred to as Pt-film hereafter). Preferably, crystals comprised in the Pt-film are preferentially oriented in (111) direction with respect to a surface of the substrate 1. Namely, a surface of the Pt-film (a surface which is a base of the piezoelectric film 3) is preferably mainly constituted of Pt-(111). The Pt-film can be formed (provided, deposited) using a method such as a sputtering method, or an evaporation method. The bottom electrode film 2 may also be comprised of various metals such as gold (Au), ruthenium (Ru), or iridium (Ir), an alloy mainly composed of the above various metals, or a metallic oxide such as strontium ruthenium oxide ($SrRuO_3$, abbreviated as SRO), or lanthanum nickel oxide ($LaNiO_3$, abbreviated as LNO), etc., instead of Pt. An adhesion layer 6 mainly composed of, for example, titanium (Ti), tantalum (Ta), titanium oxide ($TiO_2$), nickel (Ni), ruthenium oxide ($RuO_2$), or iridium oxide ($IrO_2$), etc., may be formed between the substrate 1 and the bottom electrode film 2 in order to enhance an adhesion between them. The adhesion layer 6 can be formed using a method such as a sputtering method, or an evaporation method. The bottom electrode film 2 has a thickness of, for example, 100 to 400 nm, and the adhesion layer 6 has a thickness of, for example, 1 to 200 nm.

The piezoelectric film 3 can be comprised of alkali niobium oxide which contains, for example, potassium (K), sodium (Na), and niobium (Nb), and which is represented by a composition formula of $(K_{1-x}Na_x)NbO_3$. Namely, the piezoelectric film 3 can be comprised of potassium sodium niobium oxide (KNN). A coefficient x [=Na/(K+Na)] in the above composition formula is a value in a range of 0<x<1. The piezoelectric film 3 is a polycrystalline film of KNN (also referred to as KNN-film 3 hereafter). A crystal structure of KNN is a perovskite structure. The KNN-film 3 may contain a substance other than K, Na, and Nb. Here, a film containing K, Na, and Nb at a concentration of 90% or more is the KNN-film 3. Examples of the substance other than K, Na, and Nb include: calcium zirconium oxide ($CaZrO_3$, abbreviated as CZO) or barium zirconium oxide ($BaZrO_3$, abbreviated as BZO). The KNN-film 3 can be formed using a method such as a sputtering method, a PLD (Pulsed Laser Deposition) method, or a sol-gel method. The KNN-film 3 has a thickness of, for example, 0.5 to 5 µm.

Preferably, crystals comprised in the KNN-film 3 are preferentially oriented in (001) direction with respect to the surface of the substrate 1 (the surface of the Si-substrate 1$a$, when the substrate 1 is, for example, the Si-substrate 1$a$ including the surface oxide film 1$b$ or the insulating film 1$d$, etc.). Namely, a surface of the KNN-film 3 (a surface which is a base of the top electrode film 4) is preferably mainly constituted of KNN-(001). By forming the KNN-film 3 directly on the Pt-film preferentially oriented in (111) direction with respect to the surface of the substrate 1, crystals comprised in the KNN-film 3 can be easily preferentially oriented in (001) direction with respect to the surface of the substrate 1. For example, 80% or more crystals in a crystal grain group comprised in the KNN-film 3 can be easily oriented in (001) direction with respect to the surface of the substrate 1, and 80% or more regions of the surface of the KNN-film 3 can be easily KNN-(001).

More than half of the crystals in the crystal grain group comprised in the KNN-film 3 preferably have a columnar structure. Further, boundaries between the crystals comprised in the KNN-film 3, namely crystal grain boundaries existing in the KNN-film 3 preferably penetrate the KNN-film 3 in a thickness direction. For example, the number of the crystal grain boundaries penetrating the KNN-film 3 in the thickness direction is preferably larger than the number of the crystal grain boundaries not penetrating the KNN-film 3 in the thickness direction (for example, crystal grain boundaries in parallel to a planar direction of the substrate 1).

The KNN-film 3 comprises crystals, (each) having a grain size (also simply referred to as "KNN-crystal grain size" hereafter) with a standard deviation of 0.42 µm or less, preferably less than 0.3 µm. The smaller standard deviation is preferable, the standard deviation being a standard deviation of the KNN-crystal grain (also referred to as "standard deviation of the KNN-film 3" hereafter). A lower limit of the standard deviation of the KNN-film 3 is not particularly limited. However, the standard deviation of the KNN-film 3 never becomes 0 (zero).

The standard deviation of the KNN-film 3 can be decreased by making an initial deposition rate faster than a latter deposition rate when forming the KNN-film 3. The standard deviation of the KNN-film 3 can be 0.42 µm or less, preferably less than 0.3 µm, because the initial deposition rate is, for example, more than 2 µm/hr and 6 µm/hr or less, preferably 3 µm/hr or more and 5 µm/hr or less, and the latter deposition rate is, for example, 0.5 µm/hr or more and 2 µm/hr or less, preferably 0.5 µm/hr or more and 1.5 µm/hr or less, more preferably 0.5 µm/hr or more and 1 µm/hr or less.

The initial deposition rate is a deposition rate in an initial stage of forming the KNN-film 3 (deposition). The initial stage of deposition is a nucleation stage of forming KNN-nuclei (KNN-crystal nuclei) on the bottom electrode film 2 (the base of the KNN-film 3). The initial deposition is performed in a period, for example, from start of forming the KNN-film 3 until 3 to 5 minutes. The latter deposition rate is a deposition rate in a latter stage of forming the KNN-film 3 (deposition). The latter stage of deposition is a stage after the initial stage of deposition, and is a nucleus growth stage of forming the KNN-film 3 by growing the nuclei formed in the initial stage of deposition.

The number of the nuclei generated on the bottom electrode film 2 can be increased (a nuclear density can be high) by making the deposition rate (that is, the initial deposition rate) fast during a nucleation. Namely, the nuclei can be densely formed on the bottom electrode film 2 (so that the nuclei are spread on the bottom electrode film 2) by making the deposition rate fast during the nucleation.

The nuclei can have a more minimized difference in sizes (the nuclei can have a more uniform size) by forming densely the nuclei in the initial stage of deposition than by forming sparsely the nuclei (forming the nuclei with a low nuclear density). Thereby, the KNN-film 3 can comprise the crystal grains, each having a uniform size. Namely, the standard deviation of the KNN-film 3 can be decreased.

Further, since the nuclei are densely formed, the nuclei can also be formed on the bottom electrode film 2 uniformly in a plane. In other words, it is also possible to avoid a situation that the nuclei are formed in a locally concentrated manner on the bottom electrode film 2 by forming densely the nuclei. When the nuclei are locally formed, KNN has a small crystal grain size in a part on the bottom electrode film 2 where the nuclei are locally formed, and KNN has a large crystal grain size in other part on the bottom electrode film 2. This results in an ununiform crystal grain size of KNN. Such an ununiform grain size of the KNN-crystals can be reduced by forming the nuclei on the bottom electrode film 2 uniformly in the plane, and therefore the KNN-film 3 can comprise the crystal grains, each having a uniform size with a small standard deviation.

Furthermore, since the nuclei are densely formed in the initial stage of deposition, the formation of the nuclei can be suppressed in the latter stage of deposition, and in the part on the bottom electrode film 2 where the nuclei are not formed. The nuclei formed in the latter stage of deposition grow so as to bridge the inter-nuclei gap of the nuclei which are formed in the initial stage of deposition and which have already started to grow. Therefore, the grain sizes of the KNN-crystals whose nuclei are formed in the latter stage of deposition and grow, become smaller than the grain sizes of the KNN-crystals whose nuclei are formed in the initial stage of deposition and grow. Also, the KNN-film 3 can comprise the crystal grains, each having a uniform size with the small standard deviation, by suppressing the formation of the nuclei in the latter stage of deposition.

The KNN-film 3 can comprise the crystals (crystal group) having an average grain size (also referred to as "average grain size of the KNN-film 3" hereafter) of, for example, 0.1 µm or more and 1.0 µm or less, preferably 0.3 µm or more and 0.5 µm or less. The average grain size of the KNN-film 3 used herein is the average grain size in a cross-section of the KNN-film 3 in the planar direction of the substrate 1. The average grain size of the KNN-film 3 can be obtained by analyzing a visual field of an image (for example, SEM image) imaged using a scanning electron microscopy or an image (for example, TEM image) imaged using a transmission electron microscopy. For example, "Image J" manufactured by Wayne Rasband can be used as an image analysis software.

Since the average grain size of the KNN-film 3 is 0.1 μm or more, the crystal grain boundaries existing in the KNN-film 3 can be reduced. Namely, a grain boundary density in the KNN-film 3 can be lowered. Since the average grain size of the KNN-film 3 is 0.3 μm or more, the grain boundary density in the KNN-film 3 can be reliably lowered. The grain boundary density used herein is a value obtained by dividing a total length of the crystal grain boundaries in the cross-section of the KNN-film 3 in the planar direction of the substrate 1 by a cross-sectional area of the cross-section of the KNN-film 3 (the grain boundary density=the total length of the crystal grain boundaries/the cross-sectional area of the KNN-film 3).

Oxygen vacancies (oxygen deficiencies) exist at a predetermined ratio inside the crystals (crystal grains) comprised in the KNN-film 3 or on the grain boundaries in the KNN-film 3. The oxygen vacancies on the grain boundaries in the KNN-film 3 sometimes move when, for example, applying an electric field to the KNN-film 3. When the oxygen vacancies move and spread over the electrode film (the bottom electrode film 2 or the top electrode film 4), the oxygen vacancies react with the metal comprised in the electrode film, resulting in causing short-circuit. Since the KNN-film 3 has the lower grain boundary density, a ratio of the oxygen vacancies on the grain boundaries in the KNN-film 3 to a total oxygen vacancies existing in the KNN-film 3 (the ratio=(the oxygen vacancies on the grain boundaries in the KNN-film 3/the total oxygen vacancies existing in the KNN-film 3)×100), can be reduced. Thereby, the oxygen vacancies that move to the electrode film when applying the electric field, etc., can be reduced. As a result, the KNN-film 3 can have a longer life.

From a viewpoint of lowering the grain boundary density in the KNN-film 3, the larger average grain size of the KNN-film 3 is preferable. However, in order to increase the average grain size of the KNN-film 3, the nuclei are required to be sparsely formed on the bottom electrode film 2, that is, the nuclei are required to be formed with the low nuclear density on the bottom electrode film 2.

Difference is likely to occur in the nuclear sizes (the nuclear sizes are likely to vary) when forming sparsely the nuclei, as compared with a case of forming densely the nuclei. Further, in this case, the nuclei are sometimes locally formed on the bottom electrode film 2. Further, in this case, in the latter stage of deposition, the nuclei formed in the initial stage of deposition start to grow, and meanwhile, the nuclei are sometimes formed in other part on the bottom electrode film 2 where the nuclei are not formed. As a result thereof, when the nuclei are sparsely formed, the KNN-film 3 sometimes comprises crystal grains, each having an ununiform size. As described above, when the KNN-film 3 comprises the crystals having the large average grain size (KNN comprises the crystals having the large crystal grain size), the standard deviation of the KNN-film 3 is sometimes increased.

Since the average grain size of the KNN-film 3 is 1.0 μm or less, the KNN-film 3 having the standard deviation of 0.42 μm or less can be reliably obtained. Since the average grain size is 0.5 μm or less, the KNN-film 3 having the standard deviation of less than 0.30 μm can be reliably obtained.

The KNN-film 3 preferably contains at least one of metallic elements selected from a group consisting of copper (Cu) and manganese (Mn) at a concentration in a range of, for example, 0.2 at % or more and 2.0 at % or less. When adding both Cu and Mn into the KNN-film 3, Cu and Mn are added into the KNN-film 3 so that a total concentration of Cu and Mn falls within the above concentration range.

Since at least one of Cu or Mn is added into the KNN-film 3 within the above concentration range, a film property of the KNN-film 3 can be improved. For example, an insulation property (a leak resistance) of the KNN-film 3 can be improved, and a dielectric constant of the KNN-film 3 can be a value suitable for applications of the piezoelectric stack 10.

For example, since the total concentration of Cu and Mn in the KNN-film 3 is within the above range, a leakage current density when applying an electric field of 250 kV/cm to the KNN-film 3 in a thickness direction, can be 500 $\mu A/cm^2$ or less, preferably 250 $\mu A/cm^2$ or less, more preferably 200 $\mu A/cm^2$ or less.

Further, for example, since the total concentration of Cu and Mn in the KNN-film 3 is within the above range, the dielectric constant of the KNN-film 3 can be 1500 or less, preferably 300 or more and 1200 or less when being measured under a condition of a frequency of 1 kHz, and ±1 V. When the piezoelectric stack 10 is utilized, for example, as a sensor, the above range of the dielectric constant of the KNN-film 3 is less likely to cause a decrease of a sensitivity. One reason can be considered as follows: an addition amount of Cu or Mn is appropriate, and the crystals comprised in the KNN-film 3 can be preferentially oriented in (001) direction with respect to the surface of the substrate 1.

Since Cu is added into the KNN-film 3 within the above concentration range, Cu makes a pair with the oxygen vacancies on the grain boundaries in the KNN-film 3, that is, Cu on the grain boundaries traps the oxygen vacancies. As a result, the movement of the oxygen vacancies on the grain boundaries in the KNN-film 3 can be suppressed.

Further, since Cu is added into the KNN-film 3 within the above concentration range, a resistance (etching resistance) to a fluorine-based etching solution (for example, a buffered hydrofluoric acid (BHF) solution including hydrogen fluoride (HF) and ammonium fluoride ($NH_4F$), at a prescribed concentration respectively) can also be increased, in addition to the improvement of the above film property. Thereby, a formation of a protect film for protecting an exposed surface of the KNN-film 3 is not required. Namely, the BHF solution can be used as the etching solution with no need to form the protect film. As a result, processes after producing the piezoelectric stack 10 can be simplified.

The KNN-film 3 may contain an element such as lithium (Li), Ta, antimony (Sb) other than K, Na, Nb, Cu, and Mn within a range where the standard deviation of the KNN-film 3 can be maintained within the above range, for example, within a range of 5 at % or less.

The top electrode film 4 can be comprised of various metals such as, for example, Pt, Au, aluminum (Al), or Cu, or an alloy of these various metals. The top electrode film 4 can be formed (provided, deposited) using a method such as a sputtering method, an evaporation method, a plating method, or a metal paste method. The top electrode film 4 does not greatly affect the crystal structure of the KNN-film 3 unlike the bottom electrode film 2. Therefore, a material and a crystal structure of the top electrode film 4, and a method of forming the top electrode film 4 are not particularly limited. An adhesion layer mainly composed of, for example, Ti, Ta, $TiO_2$, Ni, etc., may be formed between the KNN-film 3 and the top electrode film 4 in order to enhance an adhesion between them. The top electrode film 4 has a thickness of, for example, 10 to 5000 nm, and the adhesion layer has a thickness of, for example, 1 to 200 nm when forming the adhesion layer.

(2) A Constitution of a Piezoelectric Device

Figure 3:
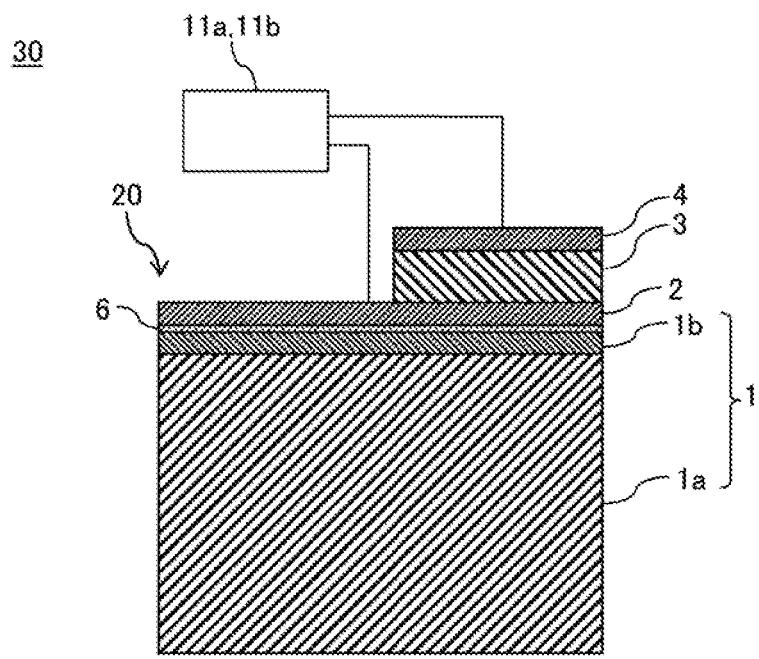
FIG. 3 is a view illustrating an example of a schematic constitution of a piezoelectric device according to an embodiment of the present disclosure.

FIG. 3 illustrates a schematic constitution view of a device 30 (also referred to as piezoelectric device 30 hereafter) including the KNN-film 3 according to the present embodiment. The piezoelectric device 30 includes at least an element 20 (an element 20 including the KNN-film 3, and also referred to as piezoelectric element 20 hereafter) obtained by forming the above piezoelectric stack 10 into a prescribed shape, and a voltage application unit 11a or a voltage detection unit 11b connected to the piezoelectric element 20. The voltage application unit 11a is a means for applying a voltage between the bottom electrode film 2 and the top electrode film 4 (between electrodes), and the voltage detection unit 11b is a means for detecting a voltage generated between the bottom electrode film 2 and the top electrode film 4 (between electrodes). Publicly-known various means can be used as the voltage application unit 11a and the voltage detection unit 11b.

By connecting the voltage application unit 11a between the bottom electrode film 2 and the top electrode film 4 of the piezoelectric element 20, the piezoelectric device 30 can function as an actuator. By applying a voltage between the bottom electrode film 2 and the top electrode film 4 using the voltage application unit 11a, the KNN-film 3 can be deformed. Various structures connected to the piezoelectric device 30 can be actuated due to the above deformation motion. In this case, the piezoelectric device 30 can be applied to, for example, a head for an inkjet printer, a MEMS mirror for a scanner, and a vibrator for an ultrasonic generator, etc.

By connecting the voltage detection unit 11b between the bottom electrode film 2 and the top electrode film 4 of the piezoelectric element 20, the piezoelectric device 30 can function as a sensor. When the KNN-film 3 is deformed according to a variation of some physical quantity, a voltage is generated between the bottom electrode film 2 and the top electrode film 4 due to the deformation. By detecting this voltage using the voltage detection unit 11b, the physical quantity applied to the KNN-film 3 can be measured. In this case, the piezoelectric device 30 can be applied to, for example, an angular velocity sensor, an ultrasonic sensor, a pressure sensor, and an acceleration sensor, etc.

(3) A Method of Manufacturing a Piezoelectric Stack, a Piezoelectric Element, and a Piezoelectric Device A method of manufacturing the above piezoelectric stack 10, the piezoelectric element 20, and the piezoelectric device 30 will be described hereafter.

First, the substrate 1 is prepared, and the adhesion layer 6 (Ti-layer) and the bottom electrode film 2 (Pt-film) are formed in this order on any one of main surfaces of the substrate 1 using, for example, the sputtering method. It is also acceptable to prepare the substrate 1 on which the adhesion layer 6 and the bottom electrode film 2 are formed in advance on any one of its main surfaces.

For example, the following conditions are given as the conditions for forming the adhesion layer 6.

Temperature (substrate temperature): 100° C. or more and 500° C. or less, preferably 200° C. or more and 400° C. or less RF power: 1000 W or more and 1500 W or less, preferably 1100 W or more and 1300 W or less Atmosphere: Argon (Ar) gas atmosphere Atmosphere pressure: 0.1 Pa or more and 0.5 Pa or less, preferably 0.2 Pa or more and 0.4 Pa or less Time: 30 seconds or more and 3 minutes or less, preferably 30 seconds or more and 2 minutes or less For example, the following conditions are given as the conditions for forming the bottom electrode film 2.

Deposition temperature (substrate temperature): 100° C. or more and 500° C. or less, preferably 200° C. or more and 400° C. or less RF power: 1000 W or more and 1500 W or less, preferably 1100 W or more and 1300 W or less Deposition atmosphere: Ar-gas atmosphere Atmosphere pressure: 0.1 Pa or more and 0.5 Pa or less, preferably 0.2 Pa or more and 0.4 Pa or less Deposition time: 3 minutes or more and 10 minutes or less, preferably 4 minutes or more and 7 minutes or less Next, the KNN-film 3 is formed on the bottom electrode film 2 using, for example, the sputtering method. When forming the KNN-film 3, the initial deposition rate is faster than the latter deposition rate. A composition ratio of the KNN-film 3 can be adjusted by controlling, for example, a composition of a target material used during sputtering. The target material can be produced by mixing and baking $K_2CO_3$-powder, $Na_2CO_3$-powder, $Nb_2O_5$-powder, Cu-powder (or CuO-powder, $Cu_2O$-powder), and MnO-powder, etc. The composition of the target material can be controlled by adjusting a mixed ratio of $K_2CO_3$-powder, $Na_2CO_3$-powder, $Nb_2O_5$-powder, Cu-powder (or CuO-powder, $Cu_2O$-powder), and MnO-powder.

For example, the following conditions are given as the conditions for forming the KNN-film 3. A deposition time is appropriately set in accordance with the thickness of the KNN-film 3 to be formed.

Deposition temperature (substrate temperature): 500° C. or more and 700° C. or less, preferably 550° C. or more and 650° C. or less RF power: 2000 W or more and 2400 W or less, preferably 2100 W or more and 2300 W or less Deposition atmosphere: Ar-gas+oxygen ($O_2$) gas atmosphere Atmosphere pressure: 0.2 Pa or more and 0.5 Pa or less, preferably 0.2 Pa or more and 0.4 Pa or less Partial pressure of Ar-gas to $O_2$-gas (partial pressure ratio of Ar/$O_2$): 30/1 to 20/1, preferably 27/1 to 23/1

Initial deposition period: a period from the start of deposition (0 minute) until 5 minutes, preferably a period from the start of deposition until 3 minutes Latter deposition period: period after the initial deposition period Initial deposition rate: more than 2.0 μm/hr and 6 μm/hr or less, preferably 3 μm/hr or more and 5 μm/hr or less Latter deposition rate: 0.5 μm/hr or more and 2 μm/hr or less, preferably 0.5 μm/hr or more and 1.5 μm/hr or less, more preferably 0.5 μm/hr or more and 1 μm/hr or less Then, the top electrode film 4 is formed on the KNN-film 3 using, for example, the sputtering method. Conditions for forming the top electrode film 4 may be the same conditions for forming the bottom electrode film 2 as described above. Thereby, the piezoelectric stack 10 including the substrate 1, the bottom electrode film 2, the KNN-film 3, and the top electrode film 4 can be obtained as illustrated in FIG. 1.

Then, by forming this piezoelectric stack 10 into a prescribed shape using an etching, etc., the piezoelectric element 20 is obtained as illustrated in FIG. 3, and by connecting the voltage application unit 11a or the voltage detection unit 11b to the piezoelectric element 20, the piezoelectric device 30 is obtained.

(4) Effect Obtained by the Present Embodiment

According to the present embodiment, one or more of the following effects can be obtained.

(a) Since the KNN-film 3 comprises the crystals having the grain size with the standard deviation of 0.42 μm or less, the KNN-film 3 can have a longer life. For example, when Highly Accelerated Life Test (abbreviated as HALT) is performed, the KNN-film 3 that requires 10000 seconds or more before dielectric breakdown, can be obtained. HALT is performed under the following conditions. First, a positive or a negative electric field of 300 kV/cm is applied to the top electrode film 4, in a state where the piezoelectric stack 10 including the KNN-film 3 is heated to a temperature of 200° C. Then, the time (seconds) from the start of applying the electric field to dielectric breakdown of the KNN-film 3 is measured, the electric field being at least one of the above electric fields (positive or negative electric field) applied under the above conditions. It is considered that the KNN-film 3 has caused dielectric breakdown, when a leakage current density flowing through the KNN-film 3 exceeds 30 mA/cm$^2$.

The present inventors performed HALT under the above conditions, for each of samples 1 to 5 of the KNN-film 3 having the standard deviation of 0.42 μm. Each of the samples 1 to 5 was prepared under the same condition within the above range described in the above embodiment. Measurement results obtained by HALT are as follows: sample 1: 15069 seconds, sample 2: 15789 seconds, sample 3: 19749 seconds, sample 4: 16869 seconds, and sample 5: 10286 seconds. The value obtained by HALT is an average value measured at 7 locations within 0.5 mmϕ per 1 sample.

(b) Since the standard deviation of the KNN-film 3 is less than 0.30 μm, the KNN-film 3 that requires 19000 seconds or more before dielectric breakdown when performing HALT under the above conditions, can be obtained. Further, since the standard deviation of the KNN-film 3 is less than 0.30 μm, the KNN-film 3 that requires 20000 seconds or more before dielectric breakdown when performing HALT under the above conditions, can also be obtained.

The present inventors performed HALT under the above conditions, for each of samples 6 to 11 of the KNN-film 3 having the standard deviation of less than 0.30 μm (for example, about 0.29 μm). Each of the samples 6 to 11 was prepared under the same condition within the above range described in the above embodiment. Measurement results obtained by HALT are as follows: sample 6: 25920 seconds, sample 7: 31166 seconds, sample 8: 44126 seconds, sample 9: 31834 seconds, sample 10: 32657 seconds, and sample 11: 19131 seconds. The value obtained by HALT is an average value measured at 7 locations within 0.5 mmϕ per 1 sample.

On the other hand, the present inventors have already confirmed that when the standard deviation of the KNN-film 3 is more than 0.42 μm, the KNN-film 3 that requires 10000 seconds or more before dielectric breakdown when performing HALT under the above conditions, cannot be obtained.

(c) The KNN-film 3 can comprise crystal grains, each having a uniform size, because the KNN-film 3 can comprise crystal nuclei formed densely on the bottom electrode film 2 with a uniform size by making the initial deposition rate faster than the latter deposition rate when forming the KNN-film 3. As a result, the standard deviation of the KNN-film 3 can be 0.42 μm or less.

(d) Since the average grain size of the KNN-film 3 is, for example, 0.1 μm or more and 1.0 μm or less, the KNN-film 3 can have a lower grain boundary density while having the standard deviation of 0.42 μm or less. As a result, the KNN-film 3 that requires 10000 seconds or more before dielectric breakdown when performing HALT under the above conditions, can be reliably obtained.

(e) Since Cu is added into the KNN-film 3, the movement of the oxygen vacancies on the grain boundaries in the KNN-film 3 can be suppressed. As a result, the oxygen vacancies in the KNN-film 3 hardly spread over the electrode film, and therefore the KNN-film 3 can have a further longer life.

(f) The present inventors have confirmed that even when adding Mn into the KNN-film 3, the same HALT results can be obtained as in a case of adding Cu into the KNN-film 3, because the standard deviation of the KNN-film 3 is 0.42 μm or less. However, in a point of obtaining the above effect of suppressing the movement of the oxygen vacancies and the above effect of improving the etching resistance of the KNN-film 3, adding Cu into the KNN-film 3 is more preferable than adding Mn thereinto.

Other Embodiment

As described above, explanation has been given specifically for the embodiments of the present disclosure. However, the present disclosure is not limited to the above embodiment or the above modified examples, and can be variously modified in a range not departing from the gist of the disclosure.

The piezoelectric stack 10 may not include the bottom electrode film 2. The piezoelectric stack 10 may be constituted including the substrate 1, the KNN-film (piezoelectric film) 3 formed on the substrate 1, and the top electrode film 4 (electrode film 4) formed on the KNN-film 3. Also in this case, since the standard deviation of the KNN-film 3 is 0.42 μm or less, preferably less than 0.30 μm, the same effects as the above embodiment can be obtained.

Figure 4:
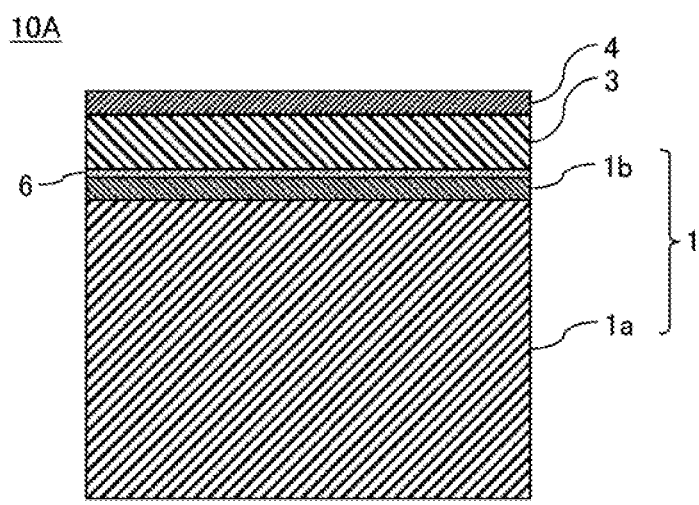
FIG. 4 is a view illustrating an example of the cross-section structure of the piezoelectric stack according to another embodiment of the present disclosure.

By forming the KNN-film 3 on the substrate 1 including the adhesion layer 6, and forming the electrode film 4 on the KNN-film 3, the piezoelectric stack 10 (also referred to as piezoelectric stack 10A, hereafter) not including the bottom electrode film 2, can be obtained as illustrated in FIG. 4. Conditions for forming (deposition) each film (layer) may be the same conditions for forming each film (layer) as described in the above embodiment. The piezoelectric stack 10A may not include the adhesion layer 6.

Also in the piezoelectric stack 10A, the KNN-film 3 can comprise the crystal nuclei formed densely on the substrate 1 (the adhesion layer 6) with a uniform size by making the initial deposition rate faster than the latter deposition rate when forming the KNN-film 3. As a result, the KNN-film 3 can comprise the crystal grains, each having a uniform size, and the standard deviation of the KNN-film 3 can fall within the above range.

Figure 5:
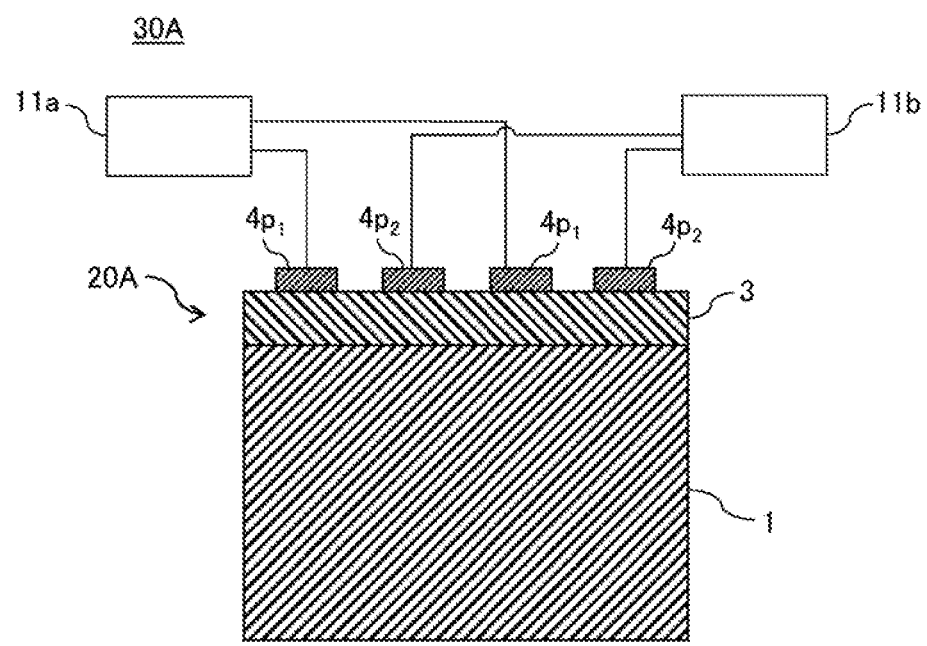
FIG. 5 is a view illustrating the schematic constitution of the piezoelectric device according to another embodiment of the present disclosure.

FIG. 5 illustrates the schematic constitution view of a piezoelectric device 30A produced using the piezoelectric stack 10A. The piezoelectric device 30A is constituted including at least a piezoelectric element 20A obtained by forming the piezoelectric stack 10A into a prescribed shape, and the voltage application unit 11a and the voltage detection unit 11b connected to the piezoelectric element 20A. In the present embodiment, the piezoelectric element 20A has a pattern electrode obtained by forming the electrode film 4 into a prescribed pattern. For example, the piezoelectric element 20A has a pair of positive and negative pattern electrodes 4p$_1$ which are input-side electrodes, and a pair of positive and negative pattern electrodes 4p$_2$ which are output-side electrodes. For example, a comb-shaped electrode (Inter Digital Transducer, abbreviated as IDT) is used as the pattern electrodes $4p_1$ and $4p_2$.

By connecting the voltage application unit 11a between the pattern electrodes $4p_1$ and connecting the voltage detection unit 11b between the pattern electrodes $4p_2$, the piezoelectric device 30A can function as a filter device such as a Surface Acoustic Wave (abbreviated as SAW) filter. By applying the voltage between the pattern electrodes $4p_1$ using the voltage application unit 11a, SAW can excite on the surface of the KNN-film 3. A frequency of excited SAW can be adjusted by adjusting, for example, a pitch between the pattern electrodes $4p_1$. For example, the shorter the pitch of IDT as the pattern electrodes $4p_1$, the higher the frequency of SAW, and the longer the above pitch, the lower the frequency of SAW. The voltage is generated between the pattern electrodes $4p_2$, due to SAW having a prescribed frequency (frequency component) determined according to the pitch of IDT as the pattern electrodes $4p_2$ in SAW which is excited by the voltage application unit 11a, propagates in the KNN-film 3, and reaches the pattern electrodes $4p_2$. By detecting this voltage using the voltage detection unit 11b, SAW having a prescribed frequency in the excited SAW can be extracted. The "prescribed frequency" as used here can include not only a prescribed frequency but also a prescribed frequency band whose center frequency is prescribed frequency.

Further, for example, an orientation control layer may be formed (provided, deposited) for controlling orientations of the crystals comprised in the KNN-film 3 between the bottom electrode film 2 and the KNN-film 3, namely directly under the KNN-film 3. In a case of not forming the bottom electrode film 2, the orientation control layer may be formed between the substrate 1 and the KNN-film 3. The orientation control layer can be comprised of a material which is a metallic oxide such as SRO, LNO, or strontium titanium oxide ($SrTiO_3$, abbreviated as STO) and which is different from the material comprised of the bottom electrode film 2. Preferably, crystals comprised in the orientation control layer are preferentially oriented in (100) direction with respect to the surface of the substrate 1.

Further, for example, in addition to Cu, or instead of Cu, the KNN-film 3 may contain other metallic elements obtained an effect equivalent to Cu at a concentration where the dielectric constant of the KNN-film 3 can be appropriate value, while obtaining the above effect of suppressing the movement of the oxygen vacancies. Also in this case, the same effects as the above embodiment, etc., can be obtained.

Further, for example, the substrate 1 may be removed from the piezoelectric stack 10, 10A when forming the above piezoelectric stack 10, 10A into the piezoelectric element 20, 20A, as long as the piezoelectric device 30, 30A produced using the piezoelectric stack 10, 10A (piezoelectric element 20, 20A) is applied to desired applications such as a sensor or an actuator.

<Preferable Aspects of the Present Disclosure>

Preferable aspects of the present disclosure will be supplementarily described hereafter.

(Supplementary Description 1)

According to an aspect of the present disclosure, there is provided a piezoelectric stack, including:
    a substrate;
    an electrode film; and
    a piezoelectric film which is comprised of alkali niobium oxide of a perovskite structure represented by a composition formula of $(K_{1-x}Na_x)NbO_3$ $(0<x<1)$,
    wherein the piezoelectric film comprises crystals having a grain size with a standard deviation of 0.42 μm or less, preferably less than 0.30 μm.

(Supplementary Description 2)

Preferably, there is provided the piezoelectric stack of the supplementary description 1, wherein when a positive or a negative electric field of 300 kV/cm is applied to the electrode film formed on the piezoelectric film at a temperature of 200° C., the time from a start of applying the electric field until a leakage current density exceeds 30 mA/cm² is 10000 seconds or more, preferably 19000 seconds or more, and more preferably 20000 seconds or more, the electric field being at least one of the above electric fields applied under the above conditions, and the leakage current being flowed through the piezoelectric film.

(Supplementary Description 3)

Preferably, there is provided the piezoelectric stack of the supplementary description 1 or 2, wherein the piezoelectric film comprises the crystals having an average grain size of 0.1 μm or more and 1.0 μm or less, preferably 0.3 μm or more and 0.5 μm or less.

(Supplementary Description 4)

Preferably, there is provided the piezoelectric stack of any one of the supplementary descriptions 1 to 3, wherein the piezoelectric film contains a metallic element selected from a group consisting of copper (Cu) and manganese (Mn) at a concentration of 0.2 at % or more and 2.0 at % or less.

(Supplementary Description 5)

Preferably, there is provided the piezoelectric stack of the supplementary description 4, wherein the metallic element is copper (Cu).

(Supplementary Description 6)

According to another aspect of the present disclosure, there is provided a piezoelectric element (piezoelectric device), including:
    a substrate;
    a bottom electrode film formed on the substrate;
    a piezoelectric film formed on the bottom electrode film, and comprised of alkali niobium oxide of a perovskite structure represented by a composition formula of $(K_{1-x}Na_x)NbO_3$ $(0<x<1)$
    a top electrode film formed on the piezoelectric film,
    wherein the piezoelectric film comprises crystals having a grain size with a standard deviation of 0.42 μm or less, preferably less than 0.30 μm.

(Supplementary Description 7)

According to further another aspect of the present disclosure, there is provided a piezoelectric element (piezoelectric device), including:
    a substrate;
    a piezoelectric film formed on the substrate, and comprised of alkali niobium oxide of a perovskite structure represented by a composition formula of $(K_{1-x}Na_x)NbO_3$ $(0<x<1)$; and
    an electrode film formed on the piezoelectric film,
    wherein the piezoelectric film comprises crystals having a grain size with a standard deviation of 0.42 μm or less, preferably less than 0.30 μm.

(Supplementary Description 8)

According to further another aspect of the present disclosure, there is provided a method of manufacturing a piezoelectric stack, including:
    forming an electrode film on a substrate; and
    forming a piezoelectric film on the electrode film, the piezoelectric film being comprised of alkali niobium oxide of a perovskite structure represented by a composition formula of $(K_{1-x}Na_x)NbO_3$ $(0<x<1)$, wherein in the formation of the piezoelectric film, an initial deposition rate is faster than a latter deposition rate.

(Supplementary Description 9)

According to further another aspect of the present disclosure, there is provided a method of manufacturing a piezoelectric stack, including:

forming a piezoelectric film on a substrate, the piezoelectric film being comprised of alkali niobium oxide of a perovskite structure represented by a composition formula of $(K_{1-x}Na_x)NbO_3$ (0<x<1), wherein in the formation of the piezoelectric film, an initial deposition rate is faster than a latter deposition rate.

(Supplementary Description 10)

Preferably, there is provided the method of the supplementary description 8 or 9, wherein the initial deposition rate is more than 2 μm/hr and 6 μm/hr or less, and the latter deposition rate is 0.5 μm/hr or more and 2 μm/hr or less.

What is claimed is:

1. A piezoelectric stack, comprising:
 a substrate;
 an electrode film; and
 a piezoelectric film which is comprised of alkali niobium oxide of a perovskite structure represented by a composition formula of $(K_{1-x}Na_x)NbO_3$ (0<x<1),
 wherein crystals of the alkali niobium oxide have an average grain size of 0.3 μm or more and 0.5 μm or less with a standard deviation of 0.42 μm or less.

2. The piezoelectric stack according to claim 1, wherein the piezoelectric film contains a metallic element selected from a group consisting of copper and manganese at a concentration of 0.2 at % or more and 2.0 at % or less.

3. A piezoelectric element, comprising:
 a substrate;
 a bottom electrode film formed on the substrate;
 a piezoelectric film formed on the bottom electrode film, and comprised of alkali niobium oxide of a perovskite structure represented by a composition formula of $(K_{1-x}Na_x)NbO_3$ (0<x<1); and
 a top electrode film formed on the piezoelectric film,
 wherein crystals of the alkali niobium oxide have an average grain size of 0.3 μm or more and 0.5 μm or less with a standard deviation of 0.42 μm or less.

4. A method of manufacturing a piezoelectric stack, comprising:
 forming an electrode film on a substrate; and
 forming a piezoelectric film on the electrode film, the piezoelectric film being comprised of alkali niobium oxide of a perovskite structure represented by a composition formula of $(K_{1-x}Na_x)NbO_3$ (0<x<1),
 wherein in the formation of the piezoelectric film, an initial deposition rate faster than a latter deposition rate, the initial deposition rate being a deposition rate in an initial stage of depositing the piezoelectric film and the latter deposition rate being a deposition rate in a latter stage of depositing the piezoelectric film.

5. The method of manufacturing a piezoelectric stack according to claim 4, wherein the initial deposition rate is more than 2 μm/hr and 6 μm/hr or less, and the latter deposition rate is 0.5 μm/hr or more and 2 μm/hr or less.

* * * * *